US009219465B2

(12) United States Patent
Kim et al.

(10) Patent No.: US 9,219,465 B2
(45) Date of Patent: Dec. 22, 2015

(54) BULK ACOUSTIC WAVE RESONATOR (75) Inventors: Chul Soo Kim, Hwaseong-si (KR); Dal Ahn, Asan-si (KR); Jae Shik Shin, Hwaseong-si (KR); In Sang Song, Osan-si (KR); Duck Hwan Kim, Goyang-si (KR); Sang Uk Son, Yongin-si (KR); Ho Soo Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 612 days.

(21) Appl. No.: 13/430,879

(22) Filed: Mar. 27, 2012

(65) Prior Publication Data
US 2013/0033340 A1 Feb. 7, 2013

(30) Foreign Application Priority Data

Aug. 5, 2011 (KR) .................. 10-2011-0078009

(51) Int. Cl.
H03H 9/02 (2006.01)
H03H 9/13 (2006.01)
(52) U.S. Cl.
CPC ......... *H03H 9/02086* (2013.01); *H03H 9/0211* (2013.01); *H03H 9/02125* (2013.01); *H03H 9/132* (2013.01)
(58) Field of Classification Search
CPC . H03H 9/02086; H03H 9/0211; H03H 9/132; H03H 9/02125
USPC .......... 333/187, 188, 133, 186; 310/322, 324, 310/326, 335, 349, 365, 366, 369
See application file for complete search history.

(56) References Cited

U.S. PATENT DOCUMENTS

| 4,184,095 | A * | 1/1980 | Stacchiotti et al. ........... 310/366 |
| 2003/0067368 | A1 | 4/2003 | Ohara et al. |
| 2003/0210108 | A1* | 11/2003 | Karlquist ..................... 333/133 |
| 2004/0130241 | A1 | 7/2004 | Iwata |
| 2013/0140959 | A1* | 6/2013 | Shin et al. .................... 310/349 |

FOREIGN PATENT DOCUMENTS

| CN | 1131844 A | 9/1996 |
| JP | 2007-110281 | 4/2007 |
| JP | 2007-243521 A | 9/2007 |
| JP | 2008-048040 A | 2/2008 |
| JP | 2008-172711 A | 7/2008 |
| JP | 2008-244653 | 10/2008 |
| JP | 2009-529833 | 8/2009 |
| KR | 10-1999-0036765 A | 5/1999 |
| WO | WO 03/058809 A2 | 7/2003 |

OTHER PUBLICATIONS

International Search Report issued Oct. 23, 2012 in counterpart International Patent Application No. PCT/KR2012/002485 (3 pages, in English).

(Continued)

*Primary Examiner* — Benny Lee
*Assistant Examiner* — Jorge Salazar, Jr.
(74) *Attorney, Agent, or Firm* — NSIP Law (57) ABSTRACT Provided is a bulk acoustic wave resonator (BAWR). The BAWR may include a bulk acoustic wave resonance unit and an anti-resonant frequency modifying unit to modify an anti-resonant frequency generated from the bulk acoustic wave resonance unit.

7 Claims, 8 Drawing Sheets

(56) References Cited

OTHER PUBLICATIONS

Extended European Search Report issued on Feb. 25, 2015 in counterpart European Patent Application No. 12822043.1 (9 pages, in English).

Pang, Wei, et al. "Electrical frequency tuning of film bulk acoustic resonator." *Microelectromechanical Systems, Journal of* 16.6 (2007): 1303-1313. (12 pages, in English).

Chinese Office Action issued on Oct. 19, 2015 in counterpart Chinese Application No. 201280038521.5 (26 pages, with English translation).

* cited by examiner

BULK ACOUSTIC WAVE RESONATOR

CROSS-REFERENCE TO RELATED APPLICATION(S)

This application claims the benefit under 35 U.S.C. §119(a) of Korean Patent Application No. 10-2011-0078009, filed on Aug. 5, 2011, in the Korean Intellectual Property Office, the entire disclosure of which is incorporated herein by reference for all purposes.

BACKGROUND

1. Field

The following description relates to a bulk acoustic wave resonator (BAWR)

2. Description of Related Art

A bulk acoustic wave resonator (BAWR) may operate through electrodes that are disposed on and/or below a piezoelectric layer. In response to a high frequency electric potential being applied to the electrodes, the piezoelectric layer may oscillate. As a result, the BAWR may function as a filter.

While the BAWR operates as a filter, a bandwidth of the BAWR may be proportional to an Acousto-electric coupling coefficient. The Acousto-electric coupling coefficient may be affected by a film characteristic of the electrodes and the piezoelectric layer. Therefore, to increase the bandwidth of the BAWR, a value of the Acousto-electric coupling coefficient needs to be increased. However, it is difficult to increase the value of the Acousto-electric coupling coefficient by improving a configuration and crystallizability of the film of the electrodes and the piezoelectric layer.

Therefore, there is a desire for a new approach to improve a bandwidth of a BAWR.

SUMMARY

In one general aspect, there is provided a bulk acoustic wave resonator (BAWR) that includes a bulk acoustic wave resonance unit including a first electrode, a second electrode, and a piezoelectric layer disposed between the first electrode and the second electrode, and an anti-resonant frequency modifying unit configured to modify an anti-resonant frequency generated by the bulk acoustic wave resonance unit, based on a ground plane formed at a distance apart from the bulk acoustic wave resonance unit.

A distance between the first electrode and the ground plane or a distance between the second electrode and the ground plane may have a value that is less than or equal to a thickness of the piezoelectric layer.

A distance between the first electrode and the ground plane and a distance between the second electrode and the ground plane may have values that are less than or equal to a thickness of the piezoelectric layer.

The ground plane may include the same material included in the first electrode or the second electrode.

The ground plane may be formed to be symmetrical to a shape of the first electrode such that a fringe capacitance component generated from fringes of the first electrode is formed in a direction of the ground plane.

The ground plane may be formed at a first distance apart from a side of the first electrode and formed at a second distance above the first electrode.

The first distance and the second distance may be determined based on a thickness of the first electrode, a thickness of the piezoelectric layer, and a thickness of the second electrode.

The anti-resonant frequency modifying unit may be configured to modify the anti-resonant frequency based on a capacitance component generated between the bulk acoustic wave resonance unit and the ground plane.

A distance between the bulk acoustic wave resonance unit and the ground plane may be determined based on a location in which a capacitance component is generated between the bulk acoustic wave resonance unit and the ground plane.

A space between the bulk acoustic wave resonance unit and the ground plane may be charged with a dielectric material.

In another general aspect, there is provided a BAWR including a substrate, an air cavity disposed on an area of the substrate, a bulk acoustic wave resonance unit including a first electrode, a piezoelectric layer and a second electrode, which are sequentially layered on the air cavity, and an anti-resonant frequency modifying unit configured to modify an anti-resonant frequency generated from the bulk acoustic wave resonance unit, based on a capacitance component generated between the bulk acoustic wave resonance unit and a ground plane formed at a distance apart from the bulk acoustic wave resonance unit.

A distance between the first electrode and the ground plane or a distance between the second electrode and the ground plane may have a value that is less than or equal to a thickness of the piezoelectric layer.

A distance between the first electrode and the ground plane and a distance between the second electrode and the ground plane may have values that are less than or equal to a thickness of the piezoelectric layer.

The ground plane may include the same material included in the first electrode or the second electrode.

The ground plane may be formed to be symmetrical to a shape of the first electrode such that a fringe capacitance component generated from fringes of the first electrode is formed in a direction of the ground plane.

The ground plane may be formed at a first distance apart from a side of the first electrode and formed at a second distance above the first electrode.

The bulk acoustic wave resonance unit may comprise a shape of a donut of which one side is open, and the ground plane may be disposed at a distance such that the ground plane is capable of generating a capacitor component with the bulk acoustic wave resonance unit provided in the shape of the donut of which one side is open.

In still another general aspect, there is provided a BAWR including a substrate, an air cavity disposed on an area of the substrate, a lower portion electrode disposed on the air cavity, a first ground plane formed on the air cavity and formed at a first distance apart from the lower portion electrode on the same plane as the lower portion electrode, a piezoelectric layer disposed on the lower portion electrode and the first ground plane, an upper portion electrode disposed on the piezoelectric layer, and a second ground plane formed on the piezoelectric layer and formed at a second distance apart from the upper portion electrode on the same plane as the upper portion electrode.

The first distance and the second distance may be determined based on a thickness of the upper portion electrode, a thickness of the piezoelectric layer, and a thickness of the lower portion electrode.

Other features and aspects may be apparent from the following detailed description, the drawings, and the claims.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

A bulk acoustic wave resonator (BAWR) may be used for input and output of wireless data. The BAWR may also be used as a filter, a transmitter, a receiver, or a duplexer that is included in a wireless communication device. There are various types of wireless communication devices for various purposes, and the number of wireless devices conventionally regarded as wired devices has rapidly increased. Thus, a number of fields to which the BAWR may be applied has expanded. For example, the BAWR may be included in a terminal such as a computer, a mobile phone, a tablet, an MP3 player, a stereo, and the like.

The BAWR may be a device that induces oscillation or waves of a predetermined frequency using resonance. For example, the device may be used as a component in a resonant frequency (RF) device such as a filter and an oscillator.

The BAWR may be levitated above a substrate through an air cavity so as to improve a reflection characteristic of an acoustic wave. In a case of the BAWR having a frequency band-pass characteristic, a plurality of resonators may be disposed on a plane and the resonators may be connected to a common electrode to improve a reflection characteristic or transmission characteristic within a frequency band range.

A resonant frequency and an anti-resonant frequency may be determined based on a thickness of a piezoelectric layer and electrodes included in the BAWR. Therefore, if the thicknesses of the piezoelectric layer and the electrodes are fixed, the resonant frequency and the anti-resonant frequency may be fixed. However, an Acousto-electric coupling coefficient may be proportional to an interval between the resonant frequency and the anti-resonant frequency. Accordingly, a value of the Acousto-electric coupling coefficient may be increased by changing the resonant frequency or the anti-resonant frequency. According to various examples herein, a BAWR may change the anti-resonant frequency using a ground plane, and thus, may increase the value of the Acousto-electric coupling coefficient and may increase the bandwidth.

Figure 1:
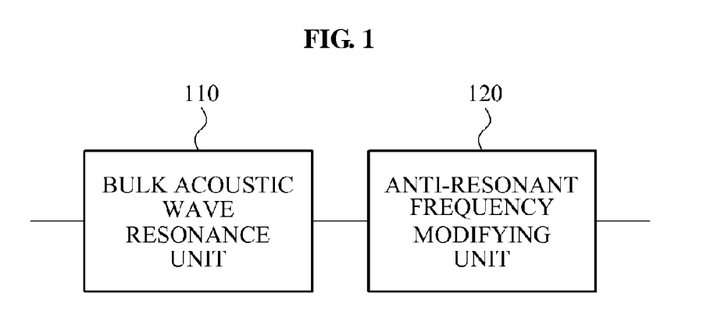
FIG. 1 is a diagram illustrating an example of bulk acoustic wave resonator (BAWR).

FIG. 1 illustrates an example of a BAWR.

Referring to FIG. 1, the BAWR includes a bulk acoustic wave resonance unit 110 and an anti-resonant frequency modifying unit 120.

The bulk acoustic wave resonance unit 110 may include an upper portion electrode, a piezoelectric layer, and a lower portion electrode. For example, the piezoelectric layer may be disposed between the upper portion electrode and the lower portion electrode. The bulk acoustic wave resonance unit 110 may generate a resonant frequency and an anti-resonant frequency through the piezoelectric layer based on an electric potential. The electric potential may be applied to the upper portion electrode and the lower portion electrode.

The bulk acoustic wave resonance unit 110 may use an electric wave of a piezoelectric material. In response to an RF signal being applied to the piezoelectric material, a mechanical oscillation may occur. The mechanical oscillation may occur in a vertical direction of a thickness of a piezoelectric film, and an acoustic wave may be generated. An example of the piezoelectric material is aluminum nitride (AlN). Resonance may occur in response to half the wavelength of the applied RF signal being substantially equal to the thickness of the piezoelectric film. In response to the resonance occurring, electric impedance may change sharply. Thus, the BAWR may be used as a filter to select a frequency.

For example, a resonant frequency may be determined based on a thickness of the piezoelectric film, an electrode wrapping the piezoelectric film, an intrinsic elastic wave velocity of the piezoelectric film, and the like. Accordingly, as the thickness of the piezoelectric film changes the resonant frequency may change. For example, as the thickness decreases, a magnitude of the resonant frequency may become greater. A resonant frequency may refer to a frequency in which a great response occurs with respect to a provided electric potential. An anti-resonant frequency may refer to a frequency in which a small response occurs with respect to a provided electric potential, and in this instance, impedance may have a greater or maximum value.

The bulk acoustic wave resonance unit 110 may be disposed on an air cavity. A reflection characteristic of an acoustic wave generated from the bulk acoustic wave resonance unit 110 may be improved through the air cavity. For example, the air cavity may be generated inside a substrate by an etching process, or may be generated on the substrate using a sacrificial layer patterned for a shape of the air cavity.

The anti-resonant frequency modifying unit 120 may modify an anti-resonant frequency generated from the bulk acoustic wave resonance unit 110, using a ground plane formed at a distance apart from the bulk acoustic wave resonance unit 110. For example, the anti-resonant frequency modifying unit 120 may include the ground plane and the piezoelectric layer.

As an example, the ground plane may be disposed at a distance apart from the upper portion electrode or the lower portion electrode included in the bulk acoustic wave resonance unit 110. The ground plane may be disposed at a distance apart from the both upper portion electrode and the lower portion electrode. The ground plane disposed at a distance apart from the upper portion electrode or the lower portion electrode may additionally generate a capacitor component to the bulk acoustic wave resonance unit 110. For example, anti-resonant frequency ($f_a$) may be calculated based on the following equation.

$$f_a = \frac{1}{2\pi\sqrt{L_m \times \frac{C_m C_o}{C_m + C_o}}} \quad (1)$$

In equation 1, $C_o$ denotes a static capacitor and indicates a capacitance value of a resonator. $L_m$ and $C_m$ denote inductance values varying based on ambient environments. If the ground plane is disposed at the distance apart from the bulk acoustic wave resonance unit 110, a static capacitor component may be additionally generated between the ground plane and the bulk acoustic wave resonance unit 110. That is, $C_o$ of the BAWR may change. The distance may denote a predetermined distance in which the capacitor component is generated between the bulk acoustic wave resonance unit 110 and the ground plane. For example, the distance may be a value that is less than or equal to a thickness of the piezoelectric layer.

The Acousto-electric coupling coefficient may be calculated based on the following equation.

$$\frac{\pi}{2} \times \frac{F_r}{F_a} \times \frac{1}{\tan\left(\frac{\pi}{2} \times \frac{F_r}{F_a}\right)} \times 100(\%) \quad (2)$$

In equation 2, $F_r$ denotes a resonant frequency, and $F_a$ denotes an anti-resonant frequency. The Acousto-electric coupling coefficient may have a value that increases as a frequency interval between the resonant frequency and the anti-resonant frequency increases. If the anti-resonant frequency is modified because of the ground plane disposed at the distance from the bulk acoustic wave resonance unit 110, the Acousto-electric coupling coefficient may be modified. The resonant frequency may not be affected by the ground plane. If the BAWR operates as a filter, a bandwidth may be proportional to a value of the Acousto-electric coupling coefficient, and thus, a bandwidth of the filter may be modified.

The capacitor component that is generated when the ground plane is disposed at the distance apart from the bulk acoustic wave resonance unit 110 may decrease $C_o$, and thus, the anti-resonant frequency may increase. If the frequency interval between the resonant frequency and the anti-resonant frequency increases due to an increase of the anti-resonant frequency, the Acousto-electric coupling coefficient may increase, and thus, the bandwidth of the filter may increase The ground plane may include the same material that is included in the upper portion electrode or the lower portion electrode. For example, the upper portion electrode or the lower portion electrode may include gold (Au), molybdenum (Mo), ruthenium (Ru), aluminum (Al), platinum (Pt), titanium (Ti), tungsten (W), palladium (Pd), chromium (Cr), nickel (Ni), and the like. In addition, the ground plane may include one or more of the above described materials.

Figure 2:
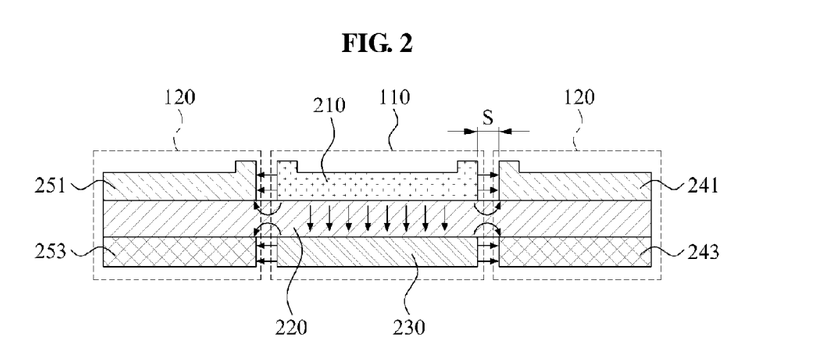
FIG. 2 is a diagram illustrating an example of a cross-sectional view of a BAWR.

FIG. 2 illustrates an example of a cross-sectional view of a BAWR.

Referring to FIG. 2, the anti-resonant frequency modifying unit 120 is disposed at a distance S apart from the bulk acoustic wave resonance unit 110.

In this example, the bulk acoustic wave resonance unit 110 includes a first electrode 210, a piezoelectric layer 220, and a second electrode 230. The anti-resonant frequency modifying unit 120 includes ground planes 241 and 251, the piezoelectric layer 220, and ground planes 243 and 253. Although the ground plane 241 and the ground plane 251 are illustrated to be separated in FIG. 2, the ground plane 241 and 251 may be one large piece with an opening in the middle for the bulk acoustic wave resonator 110. In this example, the ground plane 243 and the ground plane 253 may also be connected to each other. An example of this is described with reference to FIG. 3.

If an RF signal is applied to the first electrode 210, oscillation may occur in a direction of an arrow heading toward the second electrode 230. That is, an acoustic wave may occur. In this example, a fringe capacitor component (i.e. fringe capacitance) may be generated between a fringe of the first electrode 210 and a fringe of the second electrode 230. The fringe capacitor component may be a noise component that affects the performance of the bulk acoustic wave resonance unit 110.

The ground planes 241 and 251 are disposed at the distance S apart from both sides of the first electrode 210. Accordingly, the fringe capacitor component that occurs between the first electrode 210 and the second electrode 230 may be modified to be formed in a direction of the ground planes 241 and 251. The modified fringe capacitor component may not affect the performance of the bulk acoustic wave resonance unit 110 and may become a capacitor component used for determining an anti-resonant frequency. The ground plane 241 and 251 may be generated to be symmetrical to the first electrode 210. For example, if a side of the first electrode 210 is protruded, sides of the ground plane 241 and 251 may be protruded.

The ground planes 243 and 253 may be disposed at the distance S apart from both sides of the second electrode 230. Accordingly, a fringe capacitor component that occurs between the first electrode 210 and the second electrode 230 may be modified to be formed in a direction of the ground planes 243 and 253. The modified fringe capacitor component may not affect the performance of the bulk acoustic wave resonance unit 110, and may become a capacitor component used for determining the anti-resonant frequency.

The piezoelectric layer 220 of the bulk acoustic wave resonance unit 110 and the piezoelectric layer 220 of the anti-resonant frequency modifying unit 120 may be generated in the same process. In this example, the bulk acoustic wave resonance unit 110 and the anti-resonant frequency modifying unit 120 may be connected through the piezoelectric layer 220.

Figure 3:
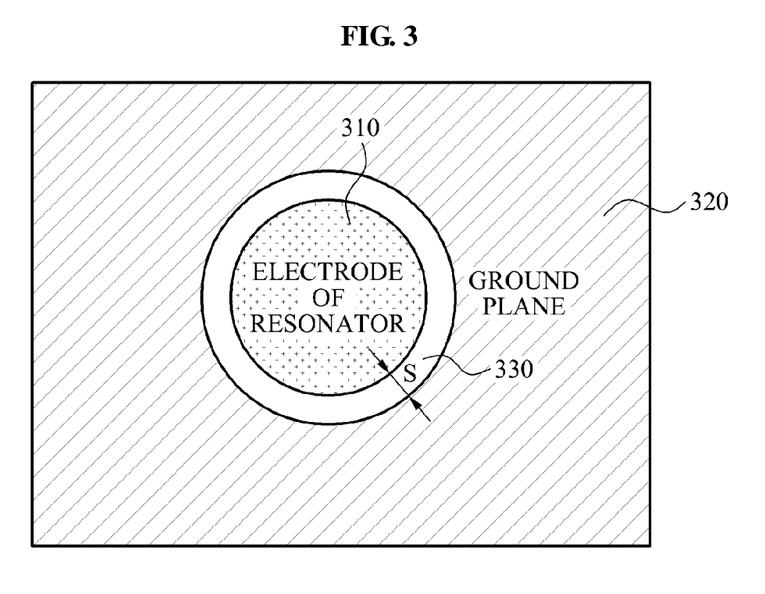
FIG. 3 is a diagram illustrating an example of a top view of a BAWR.

FIG. 3 illustrates an example of a top view of a BAWR.

FIG. 3 is an example of the BAWR of FIG. 2 as shown from above. In the BAWR, there is a distance S 330 between the first electrode 310 and the ground plane 320. A piezoelectric layer and a second electrode may be disposed below the first electrode 310, and the piezoelectric layer and another ground plane may be disposed below the ground plane 320.

The ground plane 320 may have a shape that surrounds the first electrode 310. That is, the first ground planes 241 and 251 of FIG. 2 may be of a single construction as opposed to being two separate pieces of material that are disposed on both sides of the first electrode 210. Accordingly, the first ground planes 241 and 251 may be configured as a single ground plane.

A capacitance value between the first electrode 310 and the ground plane 320 may be changed based on a distance S 330. For example, the capacitance value may change based on an area of a portion of the first electrode 310 and an area of a portion of the ground plane 320 that are facing each other. If a bandwidth of a filter is determined, the distance S 330 may be determined based on a value to which an anti-resonant frequency is to be modified. Also, thicknesses of the first electrode 310 and the ground plane 320 may be determined based on a desired value that the anti-resonant frequency is to be modified to.

Figure 4:
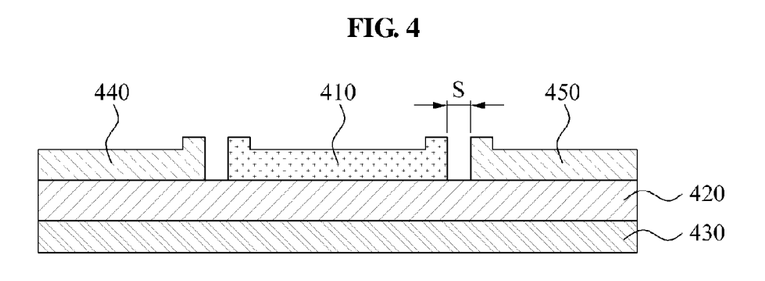
FIG. 4 is a diagram illustrating an example of a cross-sectional view of another BAWR.

FIG. 4 illustrates an example of a cross sectional view of another BAWR.

Referring to FIG. 4, ground planes 440 and 450 are disposed at a distance S from both sides of the first electrode 410. A second electrode 430 and a piezoelectric layer 420 are layered, the first electrode 410 is layered, and the ground planes 440 and 450 are generated. Although a ground plane is not formed in the second electrode 430, unlike the example of FIG. 2, an anti-resonant frequency of a bulk acoustic wave resonance unit may be modified based on a distance from the ground planes 440 and 450 disposed by both sides of the first electrode 410. In this example, in comparison to the example of FIG. 2, the anti-resonant frequency may be modified through a simpler process.

Figure 5:
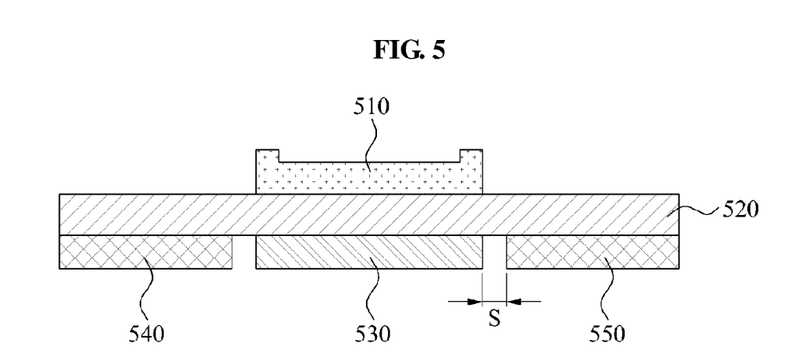
FIG. 5 is a diagram illustrating an example of a cross-sectional view of another BAWR.

FIG. 5 illustrates an example of a cross sectional view of another example BAWR.

Referring to FIG. 5, ground planes 540 and 550 are disposed at a distance S apart from the second electrode 530. For example, the ground planes 540 and 550 may be generated after the second electrode 530 is layered. A piezoelectric layer 520 and a first electrode 510 are disposed on the second electrode 530 and the ground planes 540 and 550. Although a ground plane is not formed adjacent to the first electrode 510, unlike the example of FIG. 2, an anti-resonant frequency of a bulk acoustic wave resonant unit may be modified based on a distance from ground planes 540 and 550 disposed by both sides of the second electrode 530. In this example, in comparison to the example of FIG. 2, the anti-resonant frequency may be readily modified through a simpler process.

Figure 6:
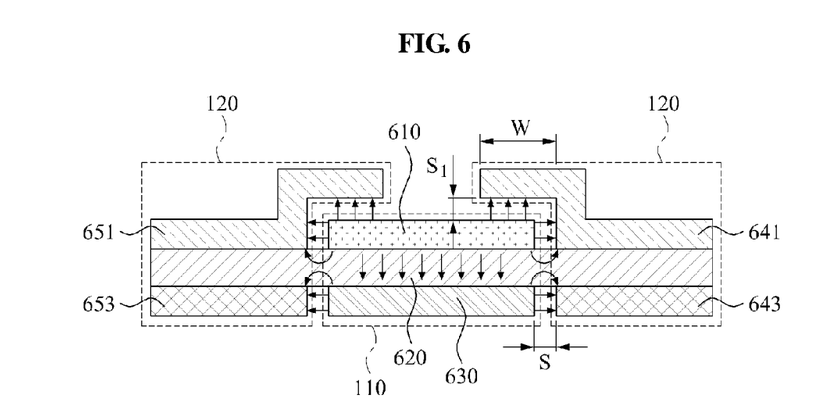
FIG. 6 is a diagram illustrating an example of a cross-sectional view of another BAWR.

FIG. 6 illustrates an example of a cross sectional view of yet another BAWR.

Referring to FIG. 6, the anti-resonant frequency modifying unit 120 is disposed at a distance S apart from the bulk acoustic wave resonance unit 110. The anti-resonant frequency modifying unit 120 is formed at a distance $S_1$ above a first electrode 610. Ground planes 641 and 651 that are formed a distance $S_1$ above the first electrode 610 may generate a capacitor component between the first electrode 610 and the ground planes 641 and 651. For example, the ground planes 641 and 651 may be formed to cover an area of a top of the first electrode 610. In this example, the capacitor component generated between the first electrode 610 and the ground planes 641 and 651 may be determined based on the area of the top of the first electrode 610. That is, if a bandwidth of a filter is determined, the covered area may be determined.

In this example, the bulk acoustic wave resonance unit 110 includes the first electrode 610, a piezoelectric layer 620, and a second electrode 630. The anti-resonant frequency modifying unit 120 includes the ground planes 641 and 651, the piezoelectric layer 620, and ground planes 643 and 653. Although the ground planes 641 and 651 are illustrated as separate components, the ground planes 641 and 651 may be of a single construction (i.e. a single plate). Also, the ground planes 643 and 653 may be connected to each other. An example of this is described with reference to FIG. 7.

If an RF signal is applied to the first electrode 610, oscillation occurs in a direction of an arrow heading toward the second electrode 630. That is, an acoustic wave may occur. In this example, a fringe capacitor component may be generated between a fringe of the first electrode 610 and a fringe of the second electrode 630. For example, the fringe capacitor component may be a noise component that affects performance of the bulk acoustic wave resonance unit 110.

The ground planes 641 and 651 are disposed at a distance S apart from both sides of the first electrode 610. Accordingly, the fringe capacitor component that occurs between the first electrode 610 and the second electrode 630 may be modified to be formed in a direction of the ground planes 641 and 651. The modified fringe capacitor component may not affect the performance of the bulk acoustic wave resonance unit 110 and may become a capacitor component used for determining an anti-resonant frequency. A bandwidth of the BAWR that operates as a filter may be determined by determining the anti-resonant frequency.

The ground planes 643 and 653 may be disposed at a distance S apart from both sides of the second electrode 631. Accordingly, a fringe capacitor component that is generated between the first electrode 610 and the second electrode 630 may be modified to be formed in a direction of the ground planes 643 and 653. The modified fringe capacitor component may not affect the performance of the bulk acoustic wave resonance unit 110, and may become a capacitor component used for determining the anti-resonant frequency.

The piezoelectric layer 620 of the bulk acoustic wave resonance unit 110 and the piezoelectric layer 620 of the anti-resonant frequency modifying unit 120 may be generated during the same process. The bulk acoustic wave resonance unit 110 and the anti-resonant frequency modifying unit 120 may be connected through the piezoelectric layer 620.

Figure 7:
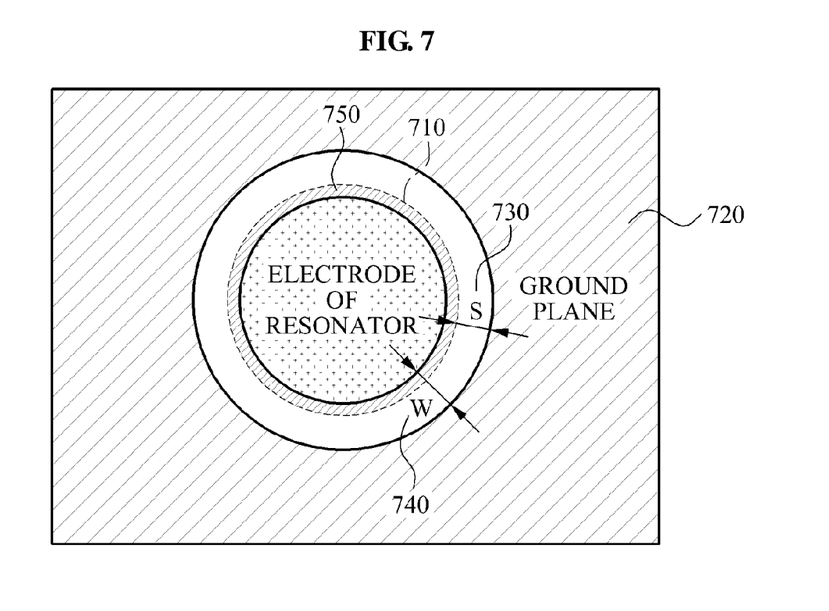
FIG. 7 is a diagram illustrating an example of a top view of another BAWR

FIG. 7 illustrates an example of a top view of another BAWR.

FIG. 7 illustrates a view of the BAWR of FIG. 6 shown from above. In the BAWR, there is a distance S 730 between a first electrode 710 and a ground plane 720. A piezoelectric layer and a second electrode are disposed below the first electrode 710, and the piezoelectric layer and another ground plane are disposed below the ground plane 720.

The ground plane 720 may have a shape that surrounds the first electrode 710. That is, the first ground planes 641 and 651 of FIG. 6 may be constructed of one piece, as opposed to being merely disposed by both sides of the first electrode 610. Accordingly, the first ground planes 641 and 651 are configured as a single ground plane.

A capacitance value between the first electrode 710 and the ground plane 720 may be changed based on a value of the distance S 730. The capacitance value may change based on an area of a portion of the first electrode 710 and an area of a portion of the ground plane 720 that are facing each other. If a bandwidth of a filter is determined, the distance S 730 may be determined based on a value to which an anti-resonant frequency is to be modified. Also, a thickness of the first electrode 710 and the ground plane 720 may be determined based on a desired value that the anti-resonant frequency is to be modified to.

A length W 740 of a portion of the ground plane 720 may include an area 750 that covers a top of the first electrode 710 and a distance S between the first electrode 710 and the ground plane 720. Due to the area 750 that covers the top of the first electrode 710, a capacitor component may occur between the first electrode 710 and the ground plane 720.

Therefore, the ground plane 720 is formed at a distance above the first electrode 710 in addition to being formed at the distance S 730 apart from both sides of the first electrode 710, and thus, an anti-resonant frequency may be modified.

Figure 8:
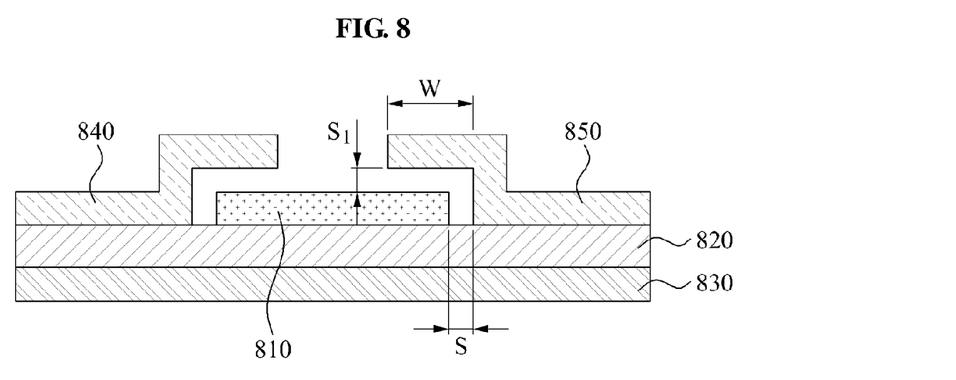
FIG. 8 is a diagram illustrating an example of a cross-sectional view of another BAWR.

FIG. 8 illustrates an example of a cross-sectional view of another BAWR.

Referring to FIG. 8, ground planes 840 and 850 are disposed at a distance S apart from the first electrode 810. In this example, the ground planes 840 and 850 are formed at a distance $S_1$ above the first electrode 810, in addition to being formed at the distance S apart from both sides of the ground planes 840 and 850. A capacitor component may occur through ground planes 840 and 850 disposed at the distance $S_1$ above the first electrode, and an anti-resonant frequency may be modified through the occurrence of the capacitor component.

A second electrode 830 and a piezoelectric layer 820 are layered, the first electrode 810 is layered, and the ground planes 840 and 850 are generated. Although a ground plane is not formed in the second electrode 830, unlike the example of FIG. 6, the anti-resonant frequency of the bulk acoustic wave resonance unit may be modified based on a distance from the ground planes 840 and 850 disposed by both sides of the first electrode 810. In this example, in comparison to the example of FIG. 6, the anti-resonant frequency may be readily modified through a simpler process.

Figure 9:
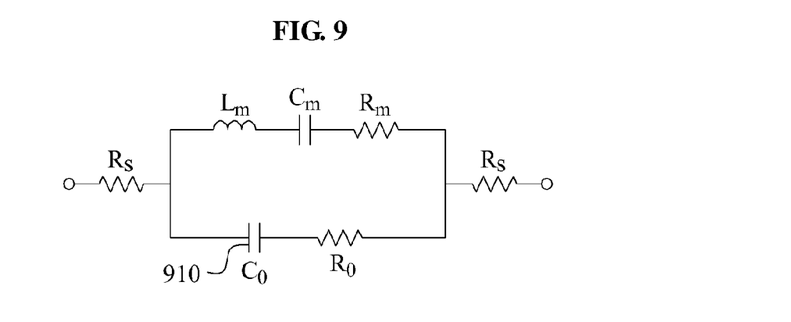
FIG. 9 is a diagram illustrating an equivalent circuit of a BAWR.

FIG. 9 illustrates an example of an equivalent circuit of a BAWR.

Referring to FIG. 9, $R_s$ denotes an ohmic loss that may be caused by an electrode, and the like, $R_o$ denotes a basic resistance value of a material including an electrode, and $C_o$ 910 denotes a static capacitor and indicates a basic capacitor value of a resonator. In this example, $L_m$, $C_m$, and $R_m$ denote inductance values that vary based on ambient environments. A resonant frequency may vary based on a product of $L_m$ and $C_m$, which may vary based on a physical thickness, a property, a mass, a temperature, and the like, of the material including the electrode. An anti-resonant frequency may be determined based on $L_m$, $C_m$, and, $C_o$ 910. If a ground plane is disposed at a distance apart from the electrode, $C_o$ 910 may vary due to a capacitor component between the ground plane and the electrode. Various types of ground planes may be formed at a distance apart from both sides of the electrode or formed at another distance above the electrode. These ground planes may modify an anti-resonant frequency. $C_o$ 910 may increase or decrease based on a positional relationship between the ground plane and the electrode.

Figure 10:
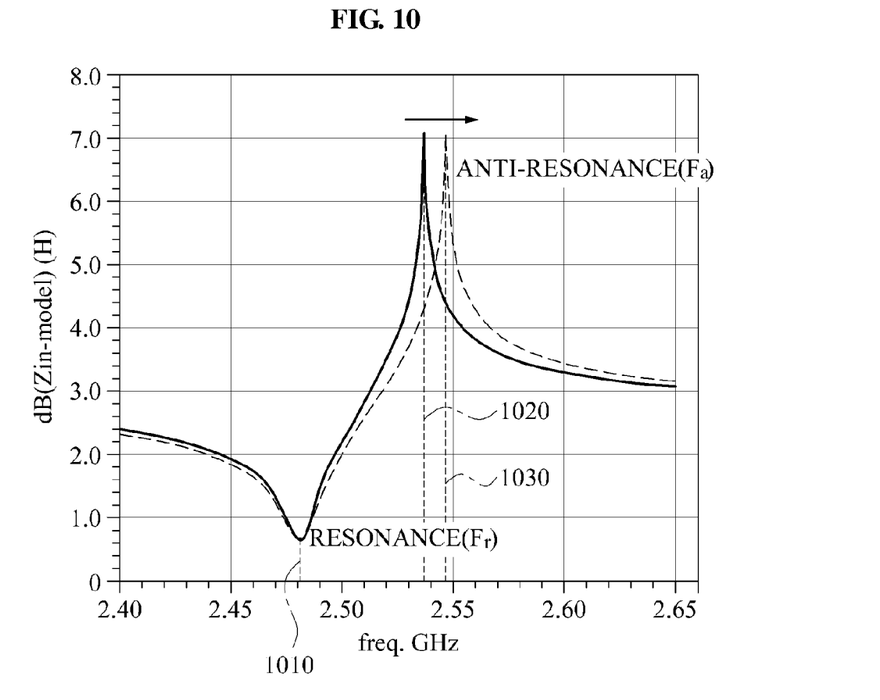
FIG. 10 is a graph illustrating an example of a modification of an anti-resonant frequency in a BAWR.

FIG. 10 is a graph that illustrates an example of a modification of an anti-resonant frequency in a BAWR.

Referring to FIG. 10, a resonant frequency 1010 in the BAWR may refer to a frequency when impedance of the BAWR is low or even at a minimal. An anti-resonant frequency 1020 in the BAWR may refer to a frequency when impedance of the BAWR is higher or even at a maximum. The anti-resonant frequency 1020 may refer to a frequency when a ground plane is not disposed around an electrode. An anti-resonant frequency 1030 may refer to a frequency when a ground plane is disposed a distance apart from the electrode.

In this example, if the ground plane is disposed at a distance apart from the electrode, a capacitor component may occur between the electrode and the ground plane. The capacitor component may affect a static capacitor value of the BAWR, and thus, the anti-resonant frequency 1020 of the BAWR may be modified to the anti-resonant frequency 1030. Because the anti-resonant frequency 1020 is modified to the anti-resonant frequency 1030, an Acousto-electric coupling coefficient determined to be proportional to a frequency interval between the resonant frequency 1010 and the anti-resonant frequency 1030 may also be modified. A bandwidth may be proportional to the Acousto-electric coupling coefficient. Accordingly, as the anti-resonant frequency 1030 increases, the bandwidth may also increase.

In the examples illustrated in FIGS. 2 through 8, because the anti-resonant frequency 1030 increases, the bandwidth of the BAWR may also increase.

Figure 11:
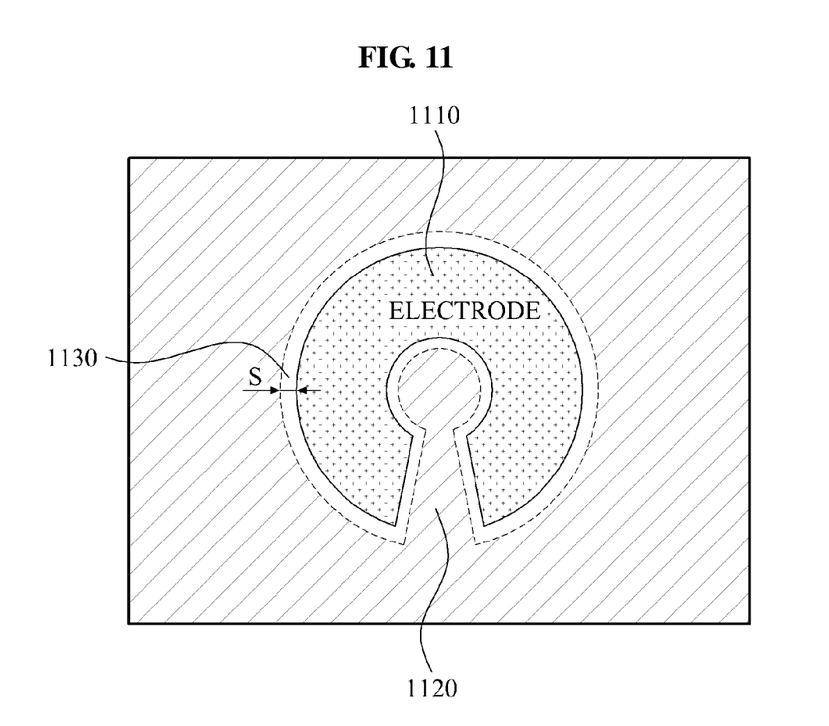
FIG. 11 is a diagram illustrating an example of a top view of another BAWR.

FIG. 11 illustrates an example of a top view of another BAWR.

Referring to FIG. 11, a first electrode 1110 has a shape of a donut with a portion removed. There is a predetermined distance S 1130 between the first electrode 1110 in the shape of a donut and the ground plane 1120. Because the first electrode 1110 has the shape of a donut, the ground plane 1120 may be disposed at a center of the first electrode 1110.

A piezoelectric layer and a second electrode are disposed below the first electrode 1110, and the piezoelectric layer and another ground plane may be disposed below the ground plane 1120. In this example, the second electrode may have the same shape as the first electrode 1110.

A capacitance value that is generated between the first electrode 1110 and the ground plane 1120 may vary based on a value corresponding to the distance S 1130. The capacitance value may vary based on an area of a portion of the first electrode 1110 and an area of a portion of the ground plane 1120 that are facing each other. If a bandwidth of a filter is determined, the distance S 1130 may be determined based on a value to which an anti-resonant frequency is to be modified to. Also, thicknesses of the first electrode 1110 and the ground plane 1120 may be determined based on the value to which the anti-resonant frequency is to be modified to.

Figure 12:
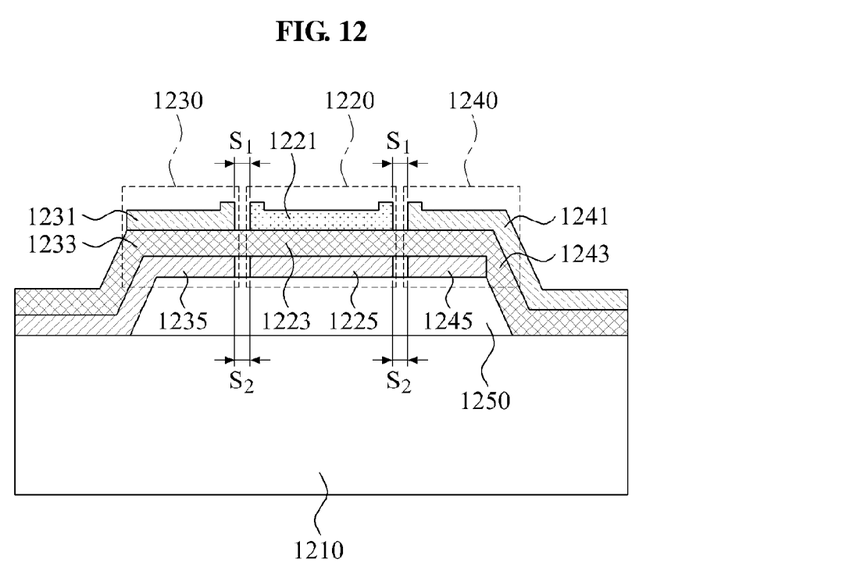
FIG. 12 is a diagram illustrating an example of a cross-sectional view of another BAWR.

FIG. 12 illustrates an example of a cross-sectional view of another BAWR.

Referring to FIG. 12, the BAWR includes a bulk acoustic wave resonant unit 1220 and anti-resonant frequency modifying units 1230 and 1240. The BAWR includes a substrate 1210. An air cavity 1250 is disposed on the substrate 1210. For example, the air cavity 1250 may be formed by layering a sacrificial layer, patterning on the sacrificial layer, and removing the sacrificial layer. The bulk acoustic wave resonance unit 1220 and the anti-resonant frequency modifying units 1230 and 1240 may be disposed on the air cavity 1250. The air cavity 1250 may be charged with a dielectric substance. For example, the dielectric substance may include an inert gas, silicon oxide ($SiO_2$), silicon nitride ($Si_3N_4$), polysilicon, a polymer, and the like.

In this example, the bulk acoustic wave resonance unit 1220 includes a lower portion electrode 1225, a piezoelectric layer 1223, and an upper portion electrode 1221. The lower portion electrode 1225 is disposed on the air cavity 1250, and the piezoelectric layer 1223 is disposed on the lower portion electrode 1225. The upper portion electrode 1221 is disposed on the piezoelectric layer 1223. For example, a conductive material included in the lower portion electrode 1225 and the upper portion electrode 1221 may include at least one of Au, Mo, Ru, Al, Pt, Ti, W, Pd, Cr, and Ni. A piezoelectric material included in the piezoelectric layer 1223 may include at least one of zinc oxide (ZnO), AlN, and quartz.

The anti-resonant frequency modifying unit 1230 includes a first ground plane 1235, a piezoelectric layer 1233, and a second ground plane 1231. The first ground plane 1235 may be formed at a distance $S_2$ apart from the lower portion electrode 1225. A capacitor component may be generated between the first ground plane 1235 and the lower portion electrode 1225. In this example, the capacitance value of a capacitor may be determined based on the distance $S_2$, a thickness of the first ground plane 1235, and a thickness of the lower portion electrode 1225.

The first ground plane 1235 may include the same material included in the lower portion electrode 1225. Accordingly, if the lower portion electrode 1225 is formed, the first ground plane 1235 may also be formed through the same process. The piezoelectric layer 1233 and the piezoelectric layer 1223 may be formed through the same process. The second ground plane 1231 may be formed at a distance $S_1$ apart from the upper portion electrode 1221. A capacitor component may be generated between the second ground plane 1231 and the upper portion electrode 1221. In this example, the second ground plane 1231 may include the same material included in the upper portion electrode 1221. Accordingly, if the upper portion electrode 1221 is formed, the second ground plane 1231 may also be formed through the same process.

The distance $S_1$ and the distance $S_2$ may be determined based on a bandwidth of the BAWR. The distance $S_1$ and the distance $S_2$ may have the same value or different values.

The anti-resonant frequency modifying unit 1240 may include a first ground plane 1245, a piezoelectric layer 1243, and a second ground plane 1241. The first ground planes 1235 and 1245 may be connected to each other so as to be configured as a single ground plane in comparison to being disposed by both sides of the lower portion electrode 1225, separately. The second ground planes 1231 and 1241 may not disposed by both sides of the upper portion electrode 1221 and may be connected to each other so as to be configured as a single ground plane. The anti-resonant frequency may be modified based on the capacitor component that is generated between the first ground planes 1235 and 1245 and the lower portion electrode 1225, and the capacitor component generated between the second ground planes 1231 and 1241 and the upper portion electrode 1221. A bandwidth may also be modified by modification of the anti-resonant frequency.

In this example, a space between the first ground planes 1235 and 1245 and the lower electrode 1225, and a space between the second ground planes 1231 and 1241 and the upper portion electrode, 1221 may be charged with a dielectric substance.

Figure 13:
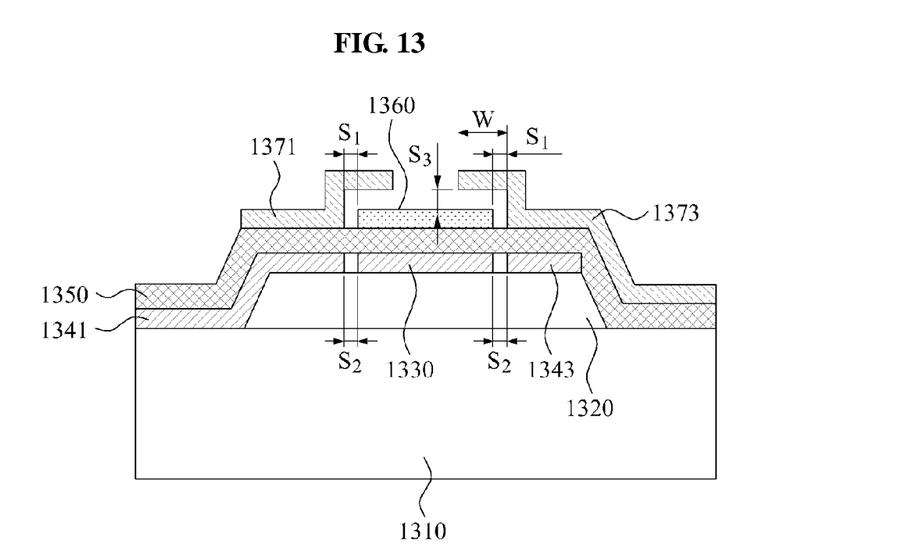
FIG. 13 is a diagram illustrating an example of a cross-sectional view of another BAWR.

FIG. 13 illustrates an example of a cross-sectional view of another BAWR.

Referring to FIG. 13, the BAWR includes a substrate 1310, an air cavity 1320, a lower portion electrode 1330, first ground planes 1341 and 1343, a piezoelectric layer 1350, an upper portion electrode 1360, and second ground planes 1371 and 1373.

The air cavity 1320 is disposed on the substrate 1310. For example, the air cavity 1320 may be formed by layering a sacrificial layer, patterning on the sacrificial layer, and removing the sacrificial layer. The air cavity 1320 may be charged with a dielectric substance. The dielectric substance may include an inert gas, $SiO_2$, $Si_3N_4$, poly-silicon, a polymer, and the like.

The lower portion electrode 1330 and the first ground planes 1341 and 1343 are disposed on the air cavity 1320. The first ground planes 1341 and 1343 may be formed at a distance $S_2$ apart from the lower portion electrode 1330. The first ground planes 1341 and 1343 may include the same material included in the lower portion electrode 1330, and may be formed through the same process in which the lower portion electrode 1330 is formed. The piezoelectric layer 1350 is disposed on the lower portion electrode 1330 and the first ground planes 1341 and 1343. The upper portion electrode 1360 and the second ground planes 1371 and 1373 are disposed on the piezoelectric layer 1350. The second ground planes 1371 and 1373 may include the same material included in the upper portion electrode 1360.

A capacitor component may be generated between the first ground planes 1341 and 1343 and the lower portion electrode 1330, and a capacitor component may be generated between the second ground planes 1371 and 1373 and the upper portion electrode 1360. In this example, an anti-resonant frequency of the BAWR may increase due to the capacitor components, and thus, a bandwidth of the BAWR may increase.

The second ground planes 1371 and 1373 may be disposed at a distance $S_1$ apart from the upper portion electrode 1360. Also, predetermined portions of the second ground planes 1371 and 1373 are formed to be bent, and the second ground planes 1371 and 1373 may be disposed at a distance $S_3$ above the upper portion electrode 1360. In this example, a length of the bent shape is W. The distance $S_1$, the distance $S_2$, and the distance $S_3$ may be values that are less than or equal to a thickness of the piezoelectric layer 1350. Also, the distance $S_1$, the distance $S_2$, and the distance $S_3$ may each be the same value, or one or more may be the different values.

A space between the first ground planes 1341 and 1343 and the lower portion electrode 1330, and a space between the second ground planes 1371 and 1373 and the upper portion electrode 1360, may be charged with a dielectric substance.

Various examples herein are directed towards a BAWR that adjusts an Acousto-electric coupling coefficient using a capacitance generated from a bulk acoustic wave resonance unit and a ground plane.

Various examples herein are directed towards a BAWR that modifies an anti-resonant frequency to adjust an Acousto-electric coupling coefficient, and thus, a bandwidth may increase.

Various examples herein are directed towards a BAWR that modifies an anti-resonant frequency generated from a bulk acoustic wave resonance unit without performing an additional process, through the same process, and at the same cost as a conventional process.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable lab-top PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described herein. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A bulk acoustic wave resonator (BAWR), comprising:
   a bulk acoustic wave resonance unit comprising a first electrode, a second electrode, and a piezoelectric layer disposed between the first electrode and the second electrode; and
   an anti-resonant frequency modifying unit configured to modify an anti-resonant frequency generated by the bulk acoustic wave resonance unit, based on a ground plane formed at a distance apart from the bulk acoustic wave resonance unit,
   wherein a distance between the first electrode and the ground plane and/or a distance between the second electrode and the ground plane has a respective value that is less than or equal to a thickness of the piezoelectric layer.

2. The BAWR of claim 1, wherein the distance between the first electrode and the ground plane and the distance between the second electrode and the ground plane have values that are less than or equal to the thickness of the piezoelectric layer.

3. The BAWR of claim 1, wherein the ground plane comprises the same material that is included in the first electrode or the second electrode.

4. The BAWR of claim 1, wherein the distance between the ground plane and the first electrode is constant, such that a fringe capacitance component generated from fringes of the first electrode is formed in a direction of the ground plane.

5. The BAWR of claim 1, wherein the anti-resonant frequency modifying unit is configured to modify the anti-resonant frequency based on a capacitance component generated between the bulk acoustic wave resonance unit and the ground plane.

6. The BAWR of claim 1, wherein a space between the bulk acoustic wave resonance unit and the ground plane is charged with a dielectric material.

7. The BAWR of claim 1, wherein the distance between the bulk acoustic wave resonance unit and the ground plane is determined based on a location in which a capacitance component is formed between the bulk acoustic wave resonance unit and the ground plane.

* * * * *